United States Patent
Park et al.

(10) Patent No.: US 9,147,845 B2
(45) Date of Patent: Sep. 29, 2015

(54) SINGLE WALLED CARBON NANOTUBE-BASED PLANAR PHOTODECTOR

(71) Applicants: SAMSUNG ELECTRONICS CO., LTD., Suwon-si (KR); The Board of Trustees of the Leland Stanford Junior University, Palo Alto, CA (US)

(72) Inventors: Young-jun Park, Suwon-si (KR); Steve Park, Stanford, CA (US); Zhenan Bao, Stanford, CA (US)

(73) Assignees: SAMSUNG ELECTRONICS CO., LTD., Suwon-si (KR); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/871,377

(22) Filed: Apr. 26, 2013

(65) Prior Publication Data

US 2014/0319461 A1   Oct. 30, 2014

(51) Int. Cl.
| | |
|---|---|
| *H01L 51/00* | (2006.01) |
| *H01L 51/52* | (2006.01) |
| *H01L 27/30* | (2006.01) |
| *B82Y 30/00* | (2011.01) |
| *H01L 51/05* | (2006.01) |
| *H01L 51/42* | (2006.01) |

(52) U.S. Cl.
CPC .......... *H01L 51/0048* (2013.01); *H01L 27/305* (2013.01); *B82Y 30/00* (2013.01); *H01L 51/0566* (2013.01); *H01L 51/4253* (2013.01)

(58) Field of Classification Search
CPC ....... H01L 27/208; H01L 29/94; H01L 29/76; H01L 21/336; H01L 21/8234
USPC ............... 257/296, 306, 309, 530, 213, 531; 438/197, 253, 254, 22, 268, 270
See application file for complete search history.

(56) References Cited

U.S. PATENT DOCUMENTS

| | | | |
|---|---|---|---|
| 6,586,095 B2 | 7/2003 | Wang et al. | |
| 6,969,690 B2* | 11/2005 | Zhou et al. | 438/787 |
| 7,705,523 B2 | 4/2010 | Wang et al. | |
| 7,723,684 B1 | 5/2010 | Haddon et al. | |

(Continued)

FOREIGN PATENT DOCUMENTS

| | | |
|---|---|---|
| KR | 10-2011-0015584 A | 2/2011 |
| KR | 10-2011-0080776 A | 7/2011 |

OTHER PUBLICATIONS

Mikhail E. Itkis et al.; "Bolometric Infrared Photoresponse of Suspended Single-Walled Carbon Nanotube Films"; Science; vol. 312; No. 413; Apr. 21, 2006; 5 pages total; DOI: 10.1126/science.1125695.

(Continued)

*Primary Examiner* — Sheng Zhu
(74) *Attorney, Agent, or Firm* — Sughrue Mion, PLLC

(57) ABSTRACT

A single-walled carbon nanotube-based planar photodetector includes a substrate; a first electrode and a second electrode disposed on the substrate and spaced apart from each other; a plurality of single-walled carbon nanotubes, each of the plurality of single-walled carbon nanotubes contacting the first electrode and the second electrode; and an adsorbent attached to a surface of at least one of the plurality of single-walled carbon nanotubes, wherein the adsorbent is capable of doping the at least one of the plurality of single-walled carbon nanotubes by photo-excitation.

19 Claims, 5 Drawing Sheets

(56) References Cited

U.S. PATENT DOCUMENTS

| | | | |
|---|---|---|---|
| 7,800,194 | B2 | 9/2010 | Freedman |
| 8,003,979 | B2 | 8/2011 | Cho et al. |
| 2007/0012980 | A1* | 1/2007 | Duan et al. .................... 257/296 |
| 2008/0251723 | A1 | 10/2008 | Ward et al. |
| 2009/0032106 | A1* | 2/2009 | Sellinger et al. ............. 136/263 |
| 2009/0066195 | A1 | 3/2009 | Wang et al. |
| 2009/0115293 | A1 | 5/2009 | Wang et al. |
| 2009/0267060 | A1* | 10/2009 | Forrest et al. ................... 257/40 |
| 2009/0309843 | A1 | 12/2009 | Kim et al. |
| 2010/0117488 | A1 | 5/2010 | Wang et al. |
| 2011/0010131 | A1 | 1/2011 | Miyajima et al. |
| 2011/0303912 | A1 | 12/2011 | Cha et al. |
| 2012/0223617 | A1 | 9/2012 | Kim et al. |
| 2013/0038178 | A1 | 2/2013 | Sohn et al. |
| 2013/0228952 | A1 | 9/2013 | Mon et al. |
| 2014/0138672 | A1 | 5/2014 | Park et al. |

OTHER PUBLICATIONS

Basudev Pradhan et al; "Carbon Nanotube—Polymer Nanocomposite Infrared Sensor"; Nano Letters; American Chemical Society; vol. 8; No. 4; 2008; pp. 1142-1146; DOI: 10.1021/nl0732880.

Xiaohui Qiu et al.; "Photoconductivity Spectra of Single-Carbon Nanotubes: Implications on the Nature of Their Excited States"; Nano Letters; American Chemical Society; vol. 5; No. 4; 2005; pp. 749-752; DOI: 10.102/nl050227y.

Hang Woo Lee; "Selective Dispersion of High Purity Semiconducting Single-Walled Carbon Nanotubes with Regioregular Poly(3-alkylthiopheme)s"; Nature Communications; vol. 2; No. 541; Nov. 15, 2011; pp. 1-8; DOI:10.1038/ncomms1545.

Bindl, et al., "Dissociating Excitons Photogenerated in Semiconducting Carbon Nanotubes at Polymeric Photovoltaic Heterojunction Interfaces", ACS Nano, American Chemical Society, Published online Oct. 5, 2010, vol. 4, No. 10, pp. 5657-5664, www.acsnano.org.

Bindl, et al., "Efficiently Harvesting Excitons from Electronic Type-Controlled Semiconducting Carbon Nanotube Films", Nano Letters, American Chemical Society, Published: Dec. 17, 2010, dx.doi.org/10.1021/nl1031343, Nano Lett. 2011, 11, pp. 455-460, pubs.acs.org/NanoLett.

Bindl, et al., "Semiconducting Carbon Nanotube/Fullerene Blended Heterojunctions for Photovoltaic Near-Infrared Photon Harvesting", Nano Research, Received: Jun. 2, 2011 / Revised: Aug. 6, 2011 / Accepted: Aug. 8. 2011, Nano Res. 2011, 4(11): pp. 1174-1179, ISSN 1998-0124, CN Nov. 5974/O4.

Bindl, et al., "Semiconducting Carbon Nanotube Photovoltaic Photodetectors", World Scientific, International Journal of High Speed Electronics and Systems, vol. 20, No. 3 (2011), pp. 687-695, Downloaded from www.worldscientific.com on Feb. 11, 2013.

* cited by examiner

SWCNT Electron Acceptor

SWCNT Electron Donor

SINGLE WALLED CARBON NANOTUBE-BASED PLANAR PHOTODETECTOR

BACKGROUND

1. Field

The present disclosure relates to a single-walled carbon nanotube-based planar photodetector that uses an adsorbent and has improved light detection speed and light detection sensitivity.

2. Description of the Related Art

Single-wall carbon nanotubes (SWCNTs) have superior electric characteristics, such as high field-effect mobility, ballistic transport, and high compatibility with high-k dielectric materials, and may be made into an electric field transistor that would enable the production of high speed field-effect transistors superior to the currently existing silicon-based devices. In addition, their unique optical properties, such as band gap tunability, may enable the tunable emission and detection of specific wavelengths of light.

A photodetector detects an optical signal and converts it to an electric signal. The photodetector may be a vertical photodetector in which two electrodes are arranged parallel to the light's incident direction or a horizontal photodetector in which two electrodes are arranged vertically with respect to the light's incident direction. The horizontal photodetector may be referred to as a planar photodetector.

Many investigations have been made regarding the use of a SWCNT as a horizontal photodetector. However, when carbon nanotubes are formed into a network structure between two electrodes, the mobility of carriers may be reduced as the result of the existence of various trap sites, such as junctions, impurities, and the like. between the carbon nanotubes.

SUMMARY

One or more embodiments provide a single-walled carbon nanotube-based planar photodetector that operates at high speed and has improved sensitivity.

According to an aspect of an embodiment, there is provided a single-walled carbon nanotube-based planar photodetector including a substrate; a first electrode and a second electrode disposed on the substrate and spaced apart from each other; a plurality of single-walled carbon nanotubes, each of the plurality of single-walled carbon nanotubes contacting the first electrode and the second electrode; and an adsorbent attached to a surface of at least one of the plurality of single-walled carbon nanotubes, wherein the adsorbent is capable of doping the at least one of the plurality of single-walled carbon nanotubes by photo-excitation.

The adsorbent may be an electron acceptor that p-dopes the plurality of single-walled carbon nanotubes or an electron donor that n-dopes the plurality of single-walled carbon nanotubes.

The electron acceptor may be a fullerene or a fullerene derivative.

The fullerene derivative may be at least one selected from the group consisting of phenyl-C61-butyric acid methyl ester (PCBM), phenyl-C71-butyric acid methyl ester (PC71BM), indene-C60 bisadduct (IC60BA), and indene-C70 bisadduct (IC70BA).

The electron donor may be at least one selected from the group consisting of poly-3-hexyl thiophene (P3HT), poly[2,5-bis(3-alkylthiophen-2-yl)thieno(3,2-b)thiophene] (PBTTT), and poly[5,5'-bis(3-alkyl-2-thienyl)-2,2'-bithiophene] (PQT).

The adsorbent may be a light absorbent and the light absorbent may be any one of a quantum dot, an organic dye, and an inorganic sensitizer.

The first electrode and the second electrode may be formed of materials having different work functions.

The first electrode and the second electrode may be formed of the same electrode material, and may further include a unit for applying a predetermined voltage to the first electrode and the second electrode.

The first electrode and the second electrode may be formed of a material selected from the group consisting of aluminum (Al), gold (Au), platinum (Pt), chromium (Cr), silver (Ag), and indium tin oxide (ITO).

The single-walled carbon nanotube-based planar photodetector may further include a gate that adjusts the movement of carriers on the plurality of single-walled carbon nanotubes.

The substrate may be a back gate.

Each of the plurality of single-walled carbon nanotubes may be formed contacting the first electrode and the second electrode.

The first electrode and the second electrode may be arranged at opposite ends of each of the plurality of single-walled carbon nanotubes and may be electrically connected to the plurality of single-walled carbon nanotubes.

A length of the plurality of single-walled carbon nanotubes between the first electrode and the second electrode may be from about 0.1 to 1000 μm.

The single-walled carbon nanotube-based planar photodetector may further include a self assembled monolayer (SAM) under the plurality of single-walled carbon nanotubes on the substrate in the form of a plurality of lines, wherein the plurality of single-walled carbon nanotubes are aligned so as to closely contact a surface of the SAM.

The SAM may be formed of at least one material selected from the group consisting of octadecyltrichlorosilane (OTS), benzocyclobutene (BCB), 16-mercaptohexadecanoic acid (HMA), and alkylsiloxanes.

The plurality of single-walled carbon nanotubes may be p-doped or n-doped via irradiation by a light source.

Each of the plurality of single-walled carbon nanotubes may be a semiconductor single-walled carbon nanotube.

BRIEF DESCRIPTION OF THE DRAWINGS

The above and/or other aspects will become apparent and more readily appreciated from the following description of the embodiments, taken in conjunction with the accompanying drawings in which.

DETAILED DESCRIPTION

Figure 1:
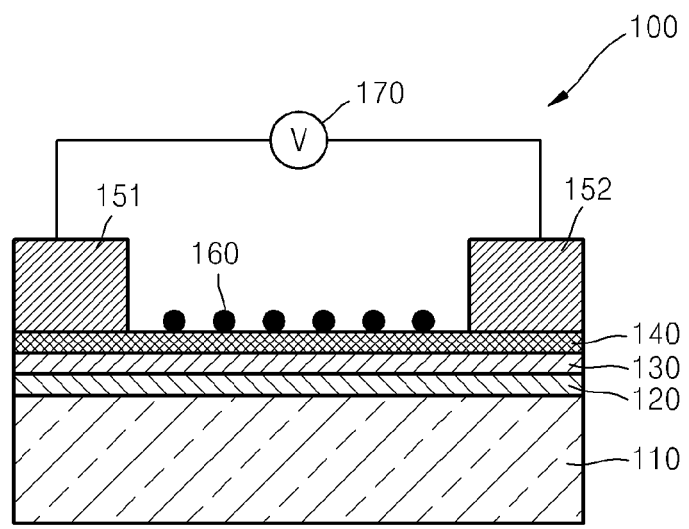
FIGS. 1 and 2 are, respectively, a cross-sectional view and a plan view schematically illustrating the structure of a SWCNT-based planar photodetector according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In the following descriptions, the terms "above" or "on" may include not only one element disposed directly on another element thereby contacting the first element, but also one element disposed above another element without contacting the first element.

As used herein, the term "and/or" includes any and all combinations of one or more of the associated listed items. Expressions such as "at least one of," when preceding a list of elements, modify the entire list of elements and do not modify the individual elements of the list.

Figure 2:
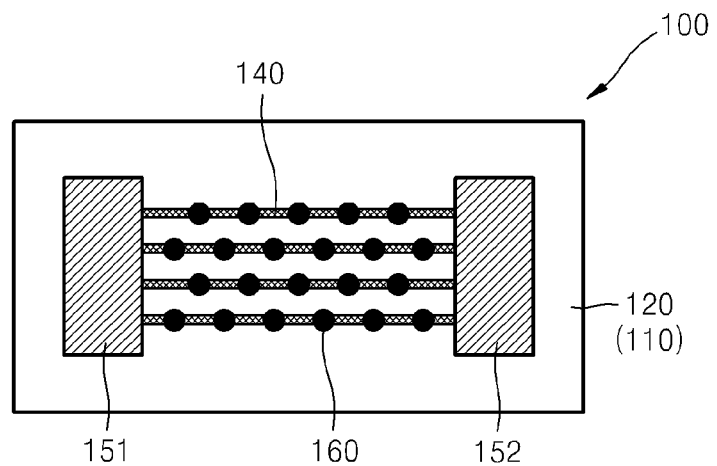

FIGS. 1 and 2 are respectively a cross-sectional view and a plan view schematically illustrating the structure of a SWCNT-based planar photodetector 100 according to an embodiment. Referring to FIGS. 1 and 2, the photodetector 100 includes a plurality of SWCNTs 140 on a substrate 110 and a first electrode 151 and a second electrode 152 electrically connected to the opposite ends of each of the SWCNTs 140. In the following description, the SWCNTs 140 are also referred to as the carbon nanotubes (CNTs) 140.

The substrate 110 may be formed of a semiconductor, glass, or plastic. The substrate 110 may be operated as a back gate when the substrate 110 is a semiconductor substrate, for example, a silicon substrate. An insulation layer 120 may also be formed on the substrate 110. The insulation layer 120 may be formed of silicon oxide or silicon nitride. The insulation layer 120 may be referred to as a gate insulation layer.

The substrate 110 may be formed of a conductive metal material. Also, when the substrate 110 is formed of glass or plastic, a separate back gate formed of metal may be formed on the substrate 110 at a position corresponding to the CNTs 140. A detailed description thereof is omitted herein.

The CNTs 140 may correspond to a channel of an electric field effect transistor. The CNTs 140 between the first and second electrodes 151 and 152 preferably have a length of about 0.1 to 1000 μm.

When the length of the CNTs 140 between the first and second electrodes 151 and 152 is about 0.1 to 2 μm, each of the CNTs 140 has a semiconductor property. When a metallic SWCNT is included in the CNTs 140, the first electrode 151 and the second electrode 152 are short-circuited so that the planar photodetector 100 does not function as a photodetector. When the length of the CNTs 140 between the first and second electrodes 151 and 152 is about 2 to 1000 μm, 75% of the CNTs 140 have a semiconductor property.

When light is irradiated onto the CNTs 140, excitons, pairs of an electron and a hole, are generated in the CNTs 140. The generated excitons are disassembled into electrons and holes as a result of the potential difference between the first and second electrons 151 and 152. The electrons are moved toward the first electrode 151 having a relatively high electric potential and the holes are moved toward the second electrode 152 having a relatively low electric potential. In the present embodiment, since the CNTs 140 are aligned in parallel, carrier mobility toward each electrode is high and the probability of the electrons and the holes recombining is low.

In contrast, in a conventional technology, when CNTs are formed in a network, the trap density is high, and carriers are moved to an electrode through several CNTs, and the mobility of carriers is lowered.

An adsorbent 160 may be attached to a surface of the CNTs 140. The adsorbent 160 improves photo-detection sensitivity.

When receiving light, the adsorbent 160 dopes the CNTs 140. The adsorbent 160 may be an electron acceptor or an electron donor. When the adsorbent 160 is an electron acceptor, the adsorbent 160 p-dopes the CNTs 140. A fullerene or a fullerene derivative may be used as the electron acceptor. Phenyl-C61-butyric acid methyl ester (PCBM), phenyl-C71-butyric acid methyl ester(PC71 BM), indene-C60 bisadduct (IC60BA), indene-C70 bisadduct (IC70BA), and similar materials. may be used as the fullerene derivative.

Figure 3:
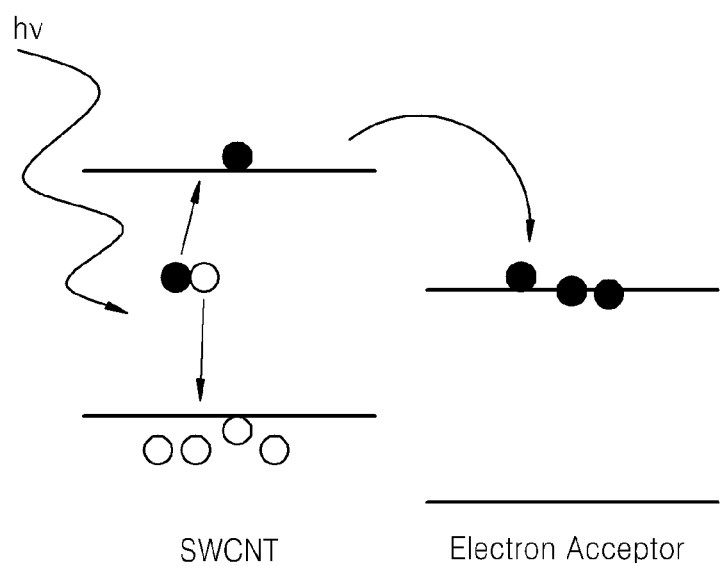
FIG. 3 is an energy band diagram for describing an operation of p-doping an electron acceptor that is an adsorbent.

FIG. 3 is an energy band diagram for describing an operation of p-doping an electron acceptor that is the adsorbent 160. Referring to FIG. 3, when light is irradiated onto the CNTs 140, excitons are generated in the CNTs 140. The excitons are disassembled into electrons and holes due to a potential difference between the first and second electrodes 151 and 152. The disassembled electrons are moved toward an electron acceptor. The holes are left in the CNTs 140 and thus the CNTs 140 become p-doped.

When the adsorbent 160 is an electron donor, the adsorbent 160 n-dopes the CNTs 140. Poly-3-hexyl thiophene (P3HT), poly[2,5-bis(3-alkylthiophen-2-yl)thieno(3,2-b)thiophene] (PBTTT), and poly[5,5'-bis(3-alkyl-2-thienyl)-2,2'-bithiophene] (PQT), and similar materials may be used as the electron donor.

Figure 4:
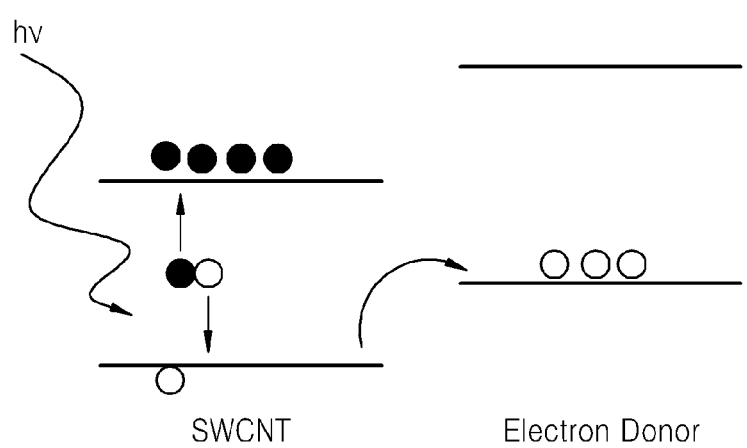
FIG. 4 is an energy band diagram for describing an operation of n-doping an electron donor that is an adsorbent.

FIG. 4 is an energy band diagram for describing an operation of n-doping an electron acceptor that is the adsorbent 160. Referring to FIG. 4, when light is irradiated onto the CNTs 140, excitons are generated in the CNT 140. The excitons are disassembled into electrons and holes due to the potential difference between the first and second electrodes 151 and 152. The disassembled holes are moved toward an electron donor. The electrons are left in the CNTs 140 and thus the CNTs 140 become n-doped.

The adsorbent 160 may be a light absorbent. The light absorbent may be a quantum dot, an organic dye, or an inorganic sensitizer. The quantum dot may be formed of CdS, CdTe, Si, or similar materials. The organic dye may be N719 dye, Z917 dye, Zn-porphyrin, Zn-phthalocyanine, or similar materials. The inorganic sensitizer may be PbS, PbSe, CdSe, or similar materials. The light absorbent receives light and provides electrons or holes to the CNTs 140.

Figure 5:
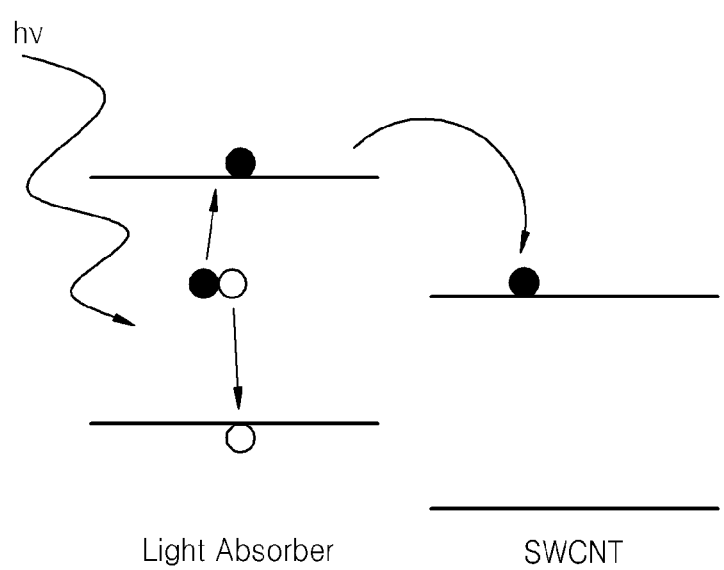
FIG. 5 is an energy band diagram for describing an operation of doping CNT using a light absorbent.

FIG. 5 is an energy band diagram for describing an operation of doping the CNTs 140 using a light absorbent. Referring to FIG. 5, when light having a wavelength corresponding to the band gap of a light absorbent, for example, a CdS quantum dot, is irradiated onto the adsorbent 160, the light absorbent absorbs the light and generates excitons. The excitons are disassembled into electrons and holes due to the electrostatic potential between the CNTs 140 and the light absorbent. The electrostatic potential is the difference between the lowest unoccupied molecular orbital (LUMO) level between the CNTs 140 and the light absorbent. Since the electrostatic potential is greater than the bonding energy of the excitons, disassembly of electrons and holes occurs. The disassembled electrons are moved to the CNTs 140 having a relatively low LUMO energy. As electrons are accumulated in the CNTs 140, the CNTs 140 become n-doped. Thus, the current in the CNTs 140 increases.

When a material in which the highest occupied molecular orbital (HOMO) of the light absorbent is greater than the HOMO of the CNTs 140, the holes of the light absorbent are moved to the CNTs 140, and thus the CNTs 140 become p-doped.

The CNTs 140 are arranged on the substrate 110 substantially parallel to each other. The first electrode 151 and the second electrode 152 are electrically connected to opposite ends of the CNTs 140. Opposite ends of each of the CNTs 140 contact the first electrode 151 and the second electrode 152, respectively.

A SAM 130 for aligning the CNTs 140 may be further formed on the insulation layer 120. The SAM 130 may be formed of, for example, octadecyltrichlorosilane (OTS), benzocyclobutene (BCB), 16-mercaptohexadecanoic acid (HMA), alkylsiloxanes, and similar materials.

The SAM 130 may be arranged on the insulation layer 120 in a pattern taking the shape of a plurality of lines. When the CNTs 140 are dispersed on the SAM 130, the CNTs 140 closely contact a functional group of the SAM 130 and thus the CNTs 140 may be aligned. Because the CNTs 140 closely contact a surface of the SAM 130, the number of carriers trapped in the surface of the insulation layer 120 is reduced.

The first and second electrodes 151 and 152 may be formed of aluminum (Al), gold (Au), platinum (Pt), chromium (Cr), silver (Ag), indium tin oxide (ITO), and similar materials. When the first and second electrodes 151 and 152 are formed of the same material, when a predetermined voltage is applied to a power source 170 connected to the first and second electrodes 151 and 152, a potential difference is generated between the first and second electrodes 151 and 152. For example, a positive voltage may be applied to the first electrode 151, and the second electrode 152 may be grounded.

The first and second electrodes 151 and 152 may be formed of materials having different work functions. For example, when the first electrode 151 is formed of Al, the second electrode 152 may be formed of Au or ITO. A potential difference may be generated between the first and second electrodes 151 and 152 and the electric potential of the first electrode 151 may be higher than that of the second electrode 152. In such a case, a built-in voltage is formed.

When a gate voltage is applied to a substrate 110 that is a back gate, movement of carriers on the CNTs 140, which functions in a role of a channel, like a typical electric field effect transistor, may be controlled. The signal to dark current ratio (SDR) may be adjusted by the gate voltage. The SDR is a value obtained by dividing the current, $I_{light-on}$, measured when light is irradiated, by the current, $I_{light-off}$, measured when light is off. The SDR increases when the photodetector 100 is turned off by the gate voltage. When the photodetector 100 is turned on, many carriers already exist in a channel (CNT) and thus the effect of light irradiation is relatively low.

Figure 6:
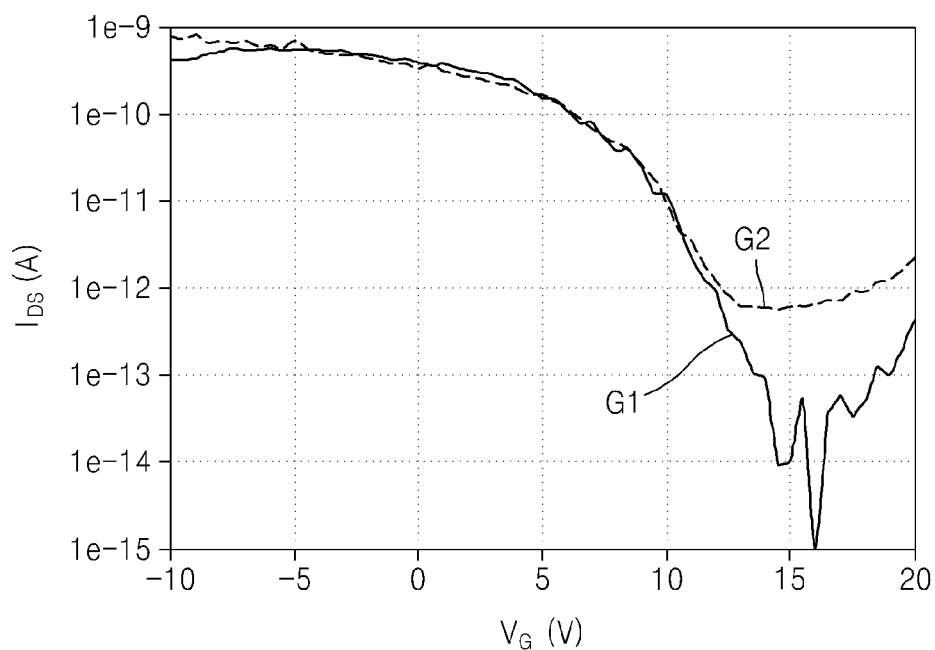
FIG. 6 is a graph showing a characteristic of a photodetector according to an embodiment when an adsorbent is not applied to the photodetector.

FIG. 6 is a graph showing a characteristic of the photodetector according to an embodiment where the adsorbent 160 is not applied to the photodetector. A change of current $I_{DS}$ between the first and second electrodes 151 and 152 is measured while changing the gate voltage. In the graph, line G1 shows a current characteristic of the photodetector when a light source such as an ultraviolet ray is not irradiated, and line G2 shows a current characteristic of the photodetector when the light source is irradiated.

Referring to FIG. 6, the SDR varies according to the gate voltage, based on whether an ultraviolet ray having a wavelength of about 1200 nm is irradiated. When the photodetector is off, the SDR increases. When the photodetector is on, the photodetection effect is low because there are too many carriers. When the photodetector is off, the measured current ($I_{DS}$) by light irradiation greatly increases. When the gate voltage is about 15 V, the $I_{DS}$ is very low, at about a pico-amp level, and thus photodetection may be difficult.

Figure 7:
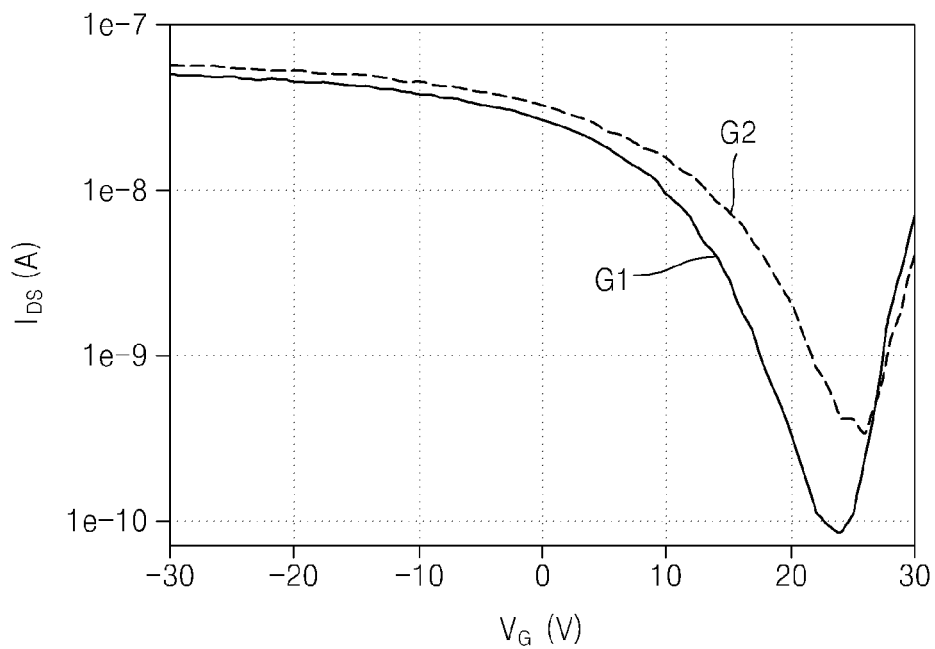
FIG. 7 is a graph showing a characteristic of a photodetector according to an embodiment when an adsorbent is applied to the photodetector.

FIG. 7 is a graph showing a characteristic of a photodetector according to an embodiment where the adsorbent 160 is applied to the photodetector. Fullerene is used as the adsorbent 160. In the graph, line G1 shows a current characteristic of the photodetector when an ultraviolet ray is not irradiated, and line G2 shows a current characteristic of a photodetector when an ultraviolet ray is irradiated. The change in the $I_{DS}$ between the first and second electrodes 151 and 152 as a function of the gate voltage is illustrated in FIG. 7.

Referring to FIG. 7, the sensitivity of the photodetector 100 is greatly increased by the use of the adsorbent 160. As may be seen in the figure, an ultraviolet ray having a wavelength of about 1200 mm is irradiated, the CNTs 140 generate excitons, and the adsorbent 160 accommodate electrons. Accordingly, the CNTs 140 are doped with holes. Thus, the threshold voltage is shifted to the right as shown at FIG. 7, which shows that the CNTs 140 are p-doped. When the gate voltage is about 20 V, the $I_{DS}$ is about a nano-amp level, which shows a remarkably high current value as compared to not using the adsorbent (see FIG. 6, for example).

According to the present embodiment, light detection sensitivity is improved by the application of the adsorbent. Also, since the application of the gate voltage enables photodetection in a state of a high SDR value, the measurement sensitivity is improved.

Figure 8:
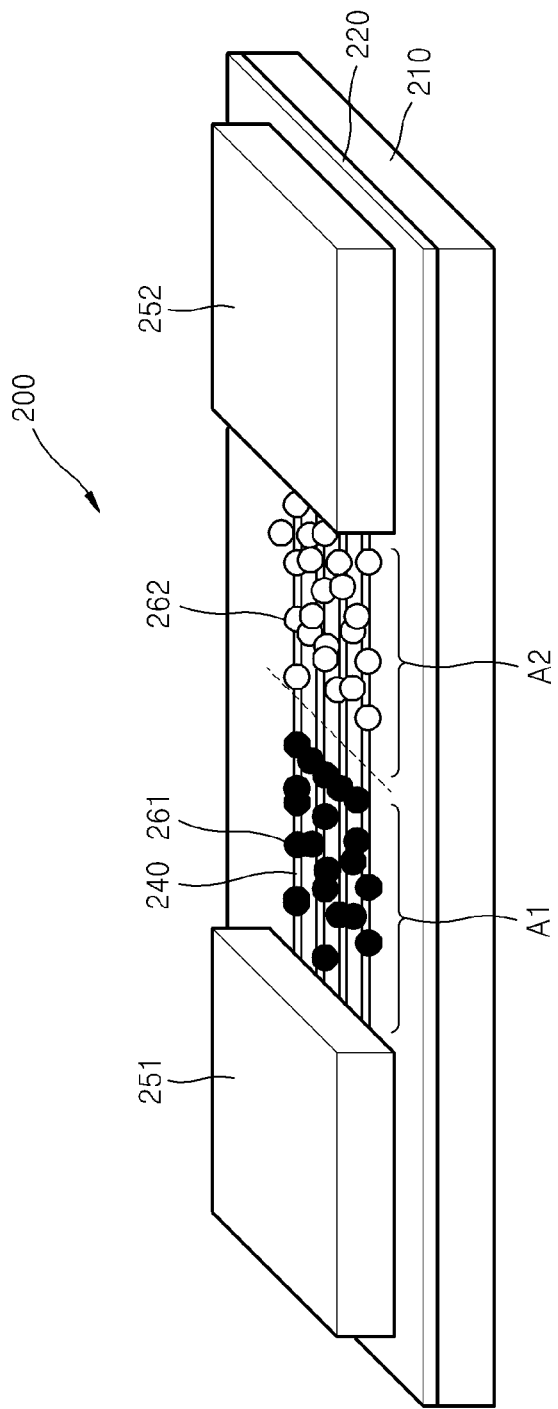
FIG. 8 schematically illustrates a PN junction structure using a photo-excitation doping characteristic.

FIG. 8 schematically illustrates a PN junction structure 200 using doping characterized by photo-excitation. Referring to FIG. 8, an insulation layer 220 is formed on a substrate 210. A plurality of SWCNTs 240 are arranged on the insulation layer 220 parallel to each other. A first electrode 251 and a second electrode 252 are arranged at the opposite ends of each of the CNTs 240. The surface of each of the CNTs 240 is divided into two regions: a first region A1 close to the first electrode 251 and a second region A2 close to the second electrode 252. An electron donor, or a quantum dot or an organic dye for performing n-doping, 261 is adsorbed in the first region A1. An electron acceptor, or a quantum dot or an organic dye for performing p-doping, 262 is adsorbed in the second region A2. The first region A1 is an n-doped region when light is irradiated, and the second region A2 is a p-doped region when light is irradiated.

The PN junction structure 200 may be used in, for example, solar cells.

As presently disclosed, a SWCNT arranged so as to directly connect two electrodes may improve the mobility of carriers.

Since an adsorbent is arranged on the surface of a SWCNT, light detection sensitivity may be improved. Also, since light detection may be performed by the application of a gate voltage when the SDR value is high, measuring sensitivity may be further improved.

It should be understood that the exemplary embodiments described therein should be considered to be descriptive only and not limiting. Descriptions of features or aspects within each embodiment should be understood as being available for other similar features or aspects in other embodiments.

What is claimed is:

1. A single-walled carbon nanotube-based planar photodetector comprising:
   a substrate;
   a self assembled monolayer (SAM) on the substrate in a form of a plurality of lines;
   a first electrode and a second electrode disposed on the substrate and spaced apart from each other;

a plurality of single-walled carbon nanotubes, each of the plurality of single-walled carbon nanotubes contacting the first electrode and the second electrode, and the plurality of single-walled carbon nanotubes being aligned to closely contact a surface of the SAM; and an adsorbent attached to a surface of at least one of the plurality of single-walled carbon nanotubes, wherein when irradiated with light, the adsorbent adsorbs either electrons or holes and p-dopes or n-dopes the at least one of the plurality of single-walled carbon nanotubes, and when not irradiated with light, the at least one of the plurality of single-walled carbon nanotubes is not p-doped or n-doped.

2. The single-walled carbon nanotube-based planar photodetector of claim 1, wherein the adsorbent is an electron acceptor that accepts electrons from the plurality of single-walled carbon nanotubes or an electron donor that donates electrons to the plurality of single-walled carbon nanotubes upon photo-excitation.

3. The single-walled carbon nanotube-based planar photodetector of claim 2, wherein the electron acceptor includes a fullerene or a fullerene derivative.

4. The single-walled carbon nanotube-based planar photodetector of claim 2, wherein the electron acceptor is at least one selected from the group consisting of phenyl-C61-butyric acid methyl ester (PCBM), phenyl-C71-butyric acid methyl ester(PC71BM), indene-C60 bisadduct (IC60BA), and indene-C70 bisadduct (IC70BA).

5. The single-walled carbon nanotube-based planar photodetector of claim 2, wherein the electron donor is at least one selected from the group consisting of poly-3-hexyl thiophene (P3HT), poly[2,5-bis(3-alkylthiophen-2-yl)thieno(3,2-b)thiophene] (PBTTT), and poly[5,5'-bis(3-alkyl-2-thienyl)-2, 2'-bithiophene] (PQT).

6. The single-walled carbon nanotube-based planar photodetector of claim 1, wherein the adsorbent is a light absorbent and the light absorbent is any one of a quantum dot, an organic dye, and an inorganic sensitizer.

7. The single-walled carbon nanotube-based planar photodetector of claim 1, wherein the first electrode and the second electrode comprise materials having different work functions.

8. The single-walled carbon nanotube-based planar photodetector of claim 1 further comprising a unit for applying a predetermined voltage to the first electrode and the second electrode, wherein the first electrode and the second electrode comprise a same electrode material.

9. The single-walled carbon nanotube-based planar photodetector of claim 1, wherein the first electrode and the second electrode comprise at least one material selected from the group consisting of aluminum (Al), gold (Au), platinum (Pt), chromium (Cr), silver (Ag), and indium tin oxide (ITO).

10. The single-walled carbon nanotube-based planar photodetector of claim 1, further comprising a gate that adjusts movement of carriers on the plurality of single-walled carbon nanotubes.

11. The single-walled carbon nanotube-based planar photodetector of claim 10, wherein the substrate is a back gate.

12. The single-walled carbon nanotube-based planar photodetector of claim 1, wherein each of the plurality of single-walled carbon nanotubes contacts both the first electrode and the second electrode.

13. The single-walled carbon nanotube-based planar photodetector of claim 12, wherein the first electrode and the second electrode are arranged at opposite ends of each of the plurality of single-walled carbon nanotubes and are electrically connected to the plurality of single-walled carbon nanotubes.

14. The single-walled carbon nanotube-based planar photodetector of claim 1, wherein a length of the plurality of single-walled carbon nanotubes between the first electrode and the second electrode is about 0.1 to 1000 μm.

15. The single-walled carbon nanotube-based planar photodetector of claim 14, wherein the plurality of single-walled carbon nanotubes between the first electrode and the second electrode is about 0.1 to 2 μm, and each of the plurality of single-walled carbon nanotube is a semiconductor single-walled carbon nanotube.

16. The single-walled carbon nanotube-based planar photodetector of claim 15, wherein the plurality of single-walled carbon nanotubes between the first electrode and the second electrode is about 2 to 1000 μm, and at least 75% of the plurality of single-walled carbon nanotube are semiconductor single-walled carbon nanotubes.

17. The single-walled carbon nanotube-based planar photodetector of claim 1, wherein the SAM comprises at least one selected from the group consisting of octadecyltrichlorosilane (OTS), benzocyclobutene (BCB), 16-mercaptohexadecanoic acid (HMA), and alkylsiloxanes.

18. The single-walled carbon nanotube-based planar photodetector of claim 1, wherein the plurality of single-walled carbon nanotubes are p-doped or n-doped by irradiation by a light source.

19. The single-walled carbon nanotube-based planar photodetector of claim 1, wherein the at least one of the plurality of single-walled carbon nanotubes is doped by the adsorbent.

* * * * *